(12) United States Patent
Pathak et al.

(10) Patent No.: US 10,331,812 B1
(45) Date of Patent: Jun. 25, 2019

(54) REPORTING STATISTICAL CONFIDENCE IN DETECTING CONTACTS BETWEEN BODIES IN A SIMULATION

(71) Applicant: Ansys, Inc., Canonsburg, PA (US)

(72) Inventors: Jay Pathak, Presto, PA (US); Jogesh Chopra, Pittsburgh, PA (US)

(73) Assignee: Ansys, Inc., Canonsburg, PA (US)

( * ) Notice: Subject to any disclaimer, the term of this patent is extended or adjusted under 35 U.S.C. 154(b) by 615 days.

(21) Appl. No.: 14/845,723

(22) Filed: Sep. 4, 2015

Related U.S. Application Data

(60) Provisional application No. 62/048,593, filed on Sep. 10, 2014.

(51) Int. Cl.
    *G06F 17/10* (2006.01)
    *G06F 17/50* (2006.01)
    *G06F 17/18* (2006.01)

(52) U.S. Cl.
    CPC .......... *G06F 17/5009* (2013.01); *G06F 17/18* (2013.01)

(58) Field of Classification Search
    CPC ....................................................... G06F 17/18
    USPC ............................................................ 703/2
    See application file for complete search history.

(56) References Cited

U.S. PATENT DOCUMENTS

| | | | |
|---|---|---|---|
| 2011/0202492 A1* | 8/2011 | Salemann | G06F 17/30241 706/50 |
| 2014/0157431 A1* | 6/2014 | Boss | H04L 63/10 726/27 |
| 2014/0298200 A1* | 10/2014 | Cierniak | H04L 65/1069 715/753 |

OTHER PUBLICATIONS

Ay, Ferhat, Bailey, Timothy, Noble, William; Statistical Confidence Estimation for Hi-C Data Reveals Regulatory Chromatin Contacts; Genome Research, 24(6); pp. 999-1011; Jun. 2014.

\* cited by examiner

*Primary Examiner* — Andre Pierre Louis
(74) *Attorney, Agent, or Firm* — Jones Day

(57) ABSTRACT

Systems and methods are provided for determining a confidence level on contact pairs identified through traditional contact detection algorithms for an assembly of bodies. A plurality of testing tolerances are identified. For each of the identified testing tolerances, a determination is made as to whether a distance between any two faces of the bodies in the assembly is less than that identified testing tolerance and when this happens a count of positive detections is increased. A ratio of the count of positive detections to the total number of times the detections are run tolerances is determined (called repeatability of a face pair), where the confidence level is based on the determined repeatability ratio.

23 Claims, 8 Drawing Sheets

| FACE ID 1 | FACE ID 2 | CONFIDENCE |
| --- | --- | --- |
| 2 | 4 | 100% |
| 1 | 4 | 88% |
| 2 | 5 | 82% |
| 1 | 5 | 74% |
| 4 | 5 | 68% |
| 3 | 4 | 66% |
| 2 | 3 | 53% |
| 1 | 2 | 23% |
| 1 | 3 | 11% |
| 3 | 5 | 5% |

Fig. 8

REPORTING STATISTICAL CONFIDENCE IN DETECTING CONTACTS BETWEEN BODIES IN A SIMULATION

CROSS-REFERENCE TO RELATED APPLICATIONS

This application claims priority to U.S. Provisional Application No. 62/048,593 filed on Sep. 10, 2014, entitled "Reporting Statistical Confidence in Detecting Contacts Between Bodies in a Simulation," the entirety of which is herein incorporated by reference.

FIELD

This disclosure is related generally to simulation and more particularly to detecting contact confidence in a simulation of multiple bodies.

BACKGROUND

A computer-implemented simulation seeks to imitate the operation of a real-world process or system over time based on a model. A simulation can analyze the behavior of an assembly comprising multiple bodies within a simulation as those bodies interact with one another and the environment. A typical assembly comprises a collection of bodies, where each body is a collection of entities that can include faces, edges, and vertices. Interactions between bodies can differ based on whether faces within a collection of bodies are in contact or not. A "contact" is established when the faces (minimally 2) are in close proximity to each other within a certain tolerance. If the tolerance is made quite large (e.g., larger than the size of bodies), traditional contact detection algorithms can incorrectly assume all bodies in contact. Identification of contact between bodies/faces in a simulation is often a time consuming, manual process. There are algorithms to do auto-contact detection however the quality of the contacts determined from these algorithms remains a research topic. As a result in industry people more often either define their contacts manually, a large time consuming process, or use the auto-detected contacts as a starting point and adjust the contact definitions manually, which can still be a time consuming process.

SUMMARY

Systems and methods are provided for determining a confidence level on contact pairs identified through traditional contact detection algorithms for an assembly of bodies. A plurality of testing tolerances are identified. For each of the identified testing tolerances, a determination is made as to whether a distance between any two faces of the bodies in the assembly is less than that identified testing tolerance and when this happens a count of positive detections is increased. A ratio of the count of positive detections to the total number of times the detections are run (e.g., the total number of identified testing tolerances) is determined (called repeatability of a face pair), where the confidence level is based on the determined repeatability ratio.

BRIEF DESCRIPTION OF THE DRAWINGS

FIG. 8 is a diagram depicting a contact confidence data structure configured to facilitate semi-automatic manual contact identification.

DETAILED DESCRIPTION

Figure 1:
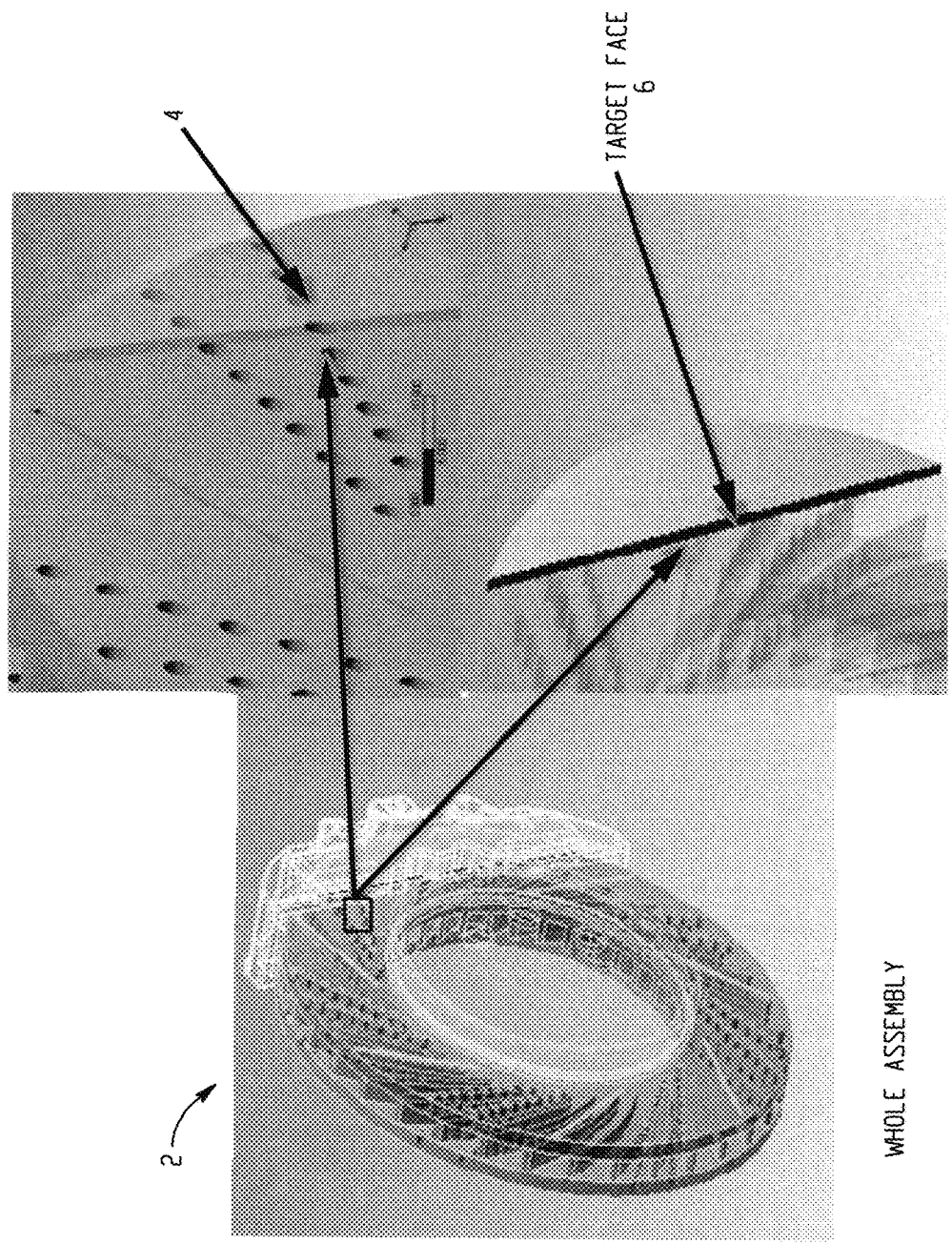
FIG. 1 is a diagram depicting an example simulation during a set up phase.

FIG. 1 is a diagram depicting an example simulation during a set up phase. The entire assembly depicted at 2 includes hundreds of individual bodies, each of those bodies having one or more face entities. During a set up phase, it is desirable to determine which faces of those bodies are in contact with faces of other bodies to determine certain characteristics of the bodies in the simulation, such as friction characteristics, stiffness characteristics, as well as others. With a typical simulation including hundreds of bodies and thousands of total faces, performing an exhaustive manual contact definition of which faces are in contact with other faces can be extremely time consuming for a simulation designer (e.g., for a simulation with n total faces, n*(n−1) contact definitions could be required). While many of the examples described herein describe detecting contact between faces of bodies, the systems and methods described herein are in many cases equally applicable to detecting contact between other geometric entities (e.g., two faces, two edges, two vertices, a face and an edge, a face and a vertex, or an edge and a vertex).

Attempts have been made to automate the generation of contacts using proximity detection algorithms. However, there have been many challenges to those attempts. In one example, a detection tolerance for the simulation set up is selected (e.g., 5 mm). Any faces of bodies in the simulation set up that are less than the tolerance distance apart are identified as being in contact, while faces of bodies that are greater than the tolerance distance apart are identified as not being in contact. Such a one size fits all tolerance selection has proved inadequate, especially in simulation set ups having bodies of widely varying sizes, especially with assemblies with very small and large bodies present in the same model. While one selected tolerance may be appropriate for determining whether faces of larger bodies are in contact, that selected tolerance may be inappropriate for determining whether faces of small bodies within the same simulation set up are in contact. Thus, a single selected tolerance will tend to either over-detect contacts for faces of smaller bodies or under-detect contacts for faces of larger bodies. As a result, many users tend to avoid existing automated contact detection processes, instead opting to set up contacts manually, a highly time consuming process (e.g., a process that could take days).

Systems and methods as described herein provide an improved process for automating detection of contact between faces of bodies in a simulation. For each (or a subset of each) pair of faces in a simulation, one or more contact measures are determined that determine the quality of contact. Based on those one or more contact measures, a confidence level is calculated that identifies how confident the process is that the two faces under consideration are in contact with one another. For example, in FIG. 1, the process determines that it is only 5% confident that the face of the hole at 4 is in contact with target face 6 (e.g., based on a large gap between the faces and low degree of overlap between the faces, as described in further detail below).

Figure 2:
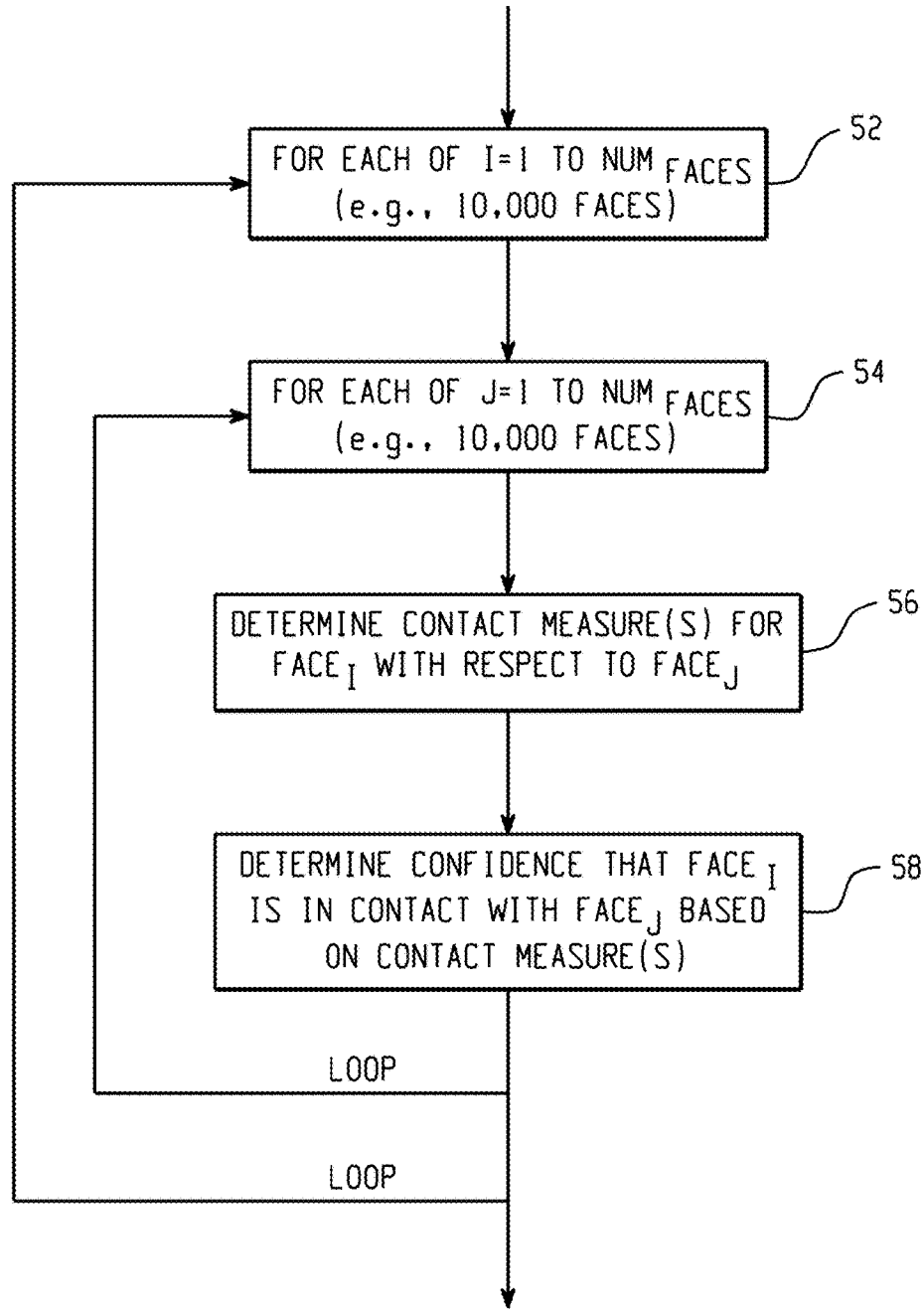
FIG. 2 is a diagram depicting an example process for identifying confidences of contacts between faces in a simulation set up.

FIG. 2 is a diagram depicting an example process for identifying confidences of contacts between faces in a simulation set up. A set of nested for-loops 52, 54 facilitates iteration through each pair of faces of bodies in a simulation set up to determine whether those pairs of faces are in contact. For each pair of faces, one or more contact measures are determined at 56. At 58, the one or more contact measures for the face pair are used to determine a confidence that the two faces under consideration are in contact. In one embodiment, based on that confidence level, a preliminary contact assignment between the two faces under consideration is made, where faces having a high confidence score (e.g., 60% or higher) at 58 are identified as being good contacts, while faces having a low confidence score (e.g., 40% or lower at 58 are identified as bad contacts. In the example of FIG. 2, where the simulation set up includes bodies having 10,000 total faces, the automation determines confidence levels for 100,000,000 face pairs in a manner that greatly reduces manual attention needed by simulation designers or other personnel, freeing their time for other more productive activities.

The following examples describe processes for determining contact measures and confidence levels for individual pairs of faces of bodies in a simulation set up. As described above with respect to FIGS. 1 and 2, processes as described herein below can be repeated many (e.g., thousands or millions) times for a single simulation, reducing manual effort necessary for proper simulation set up.

Figure 3:
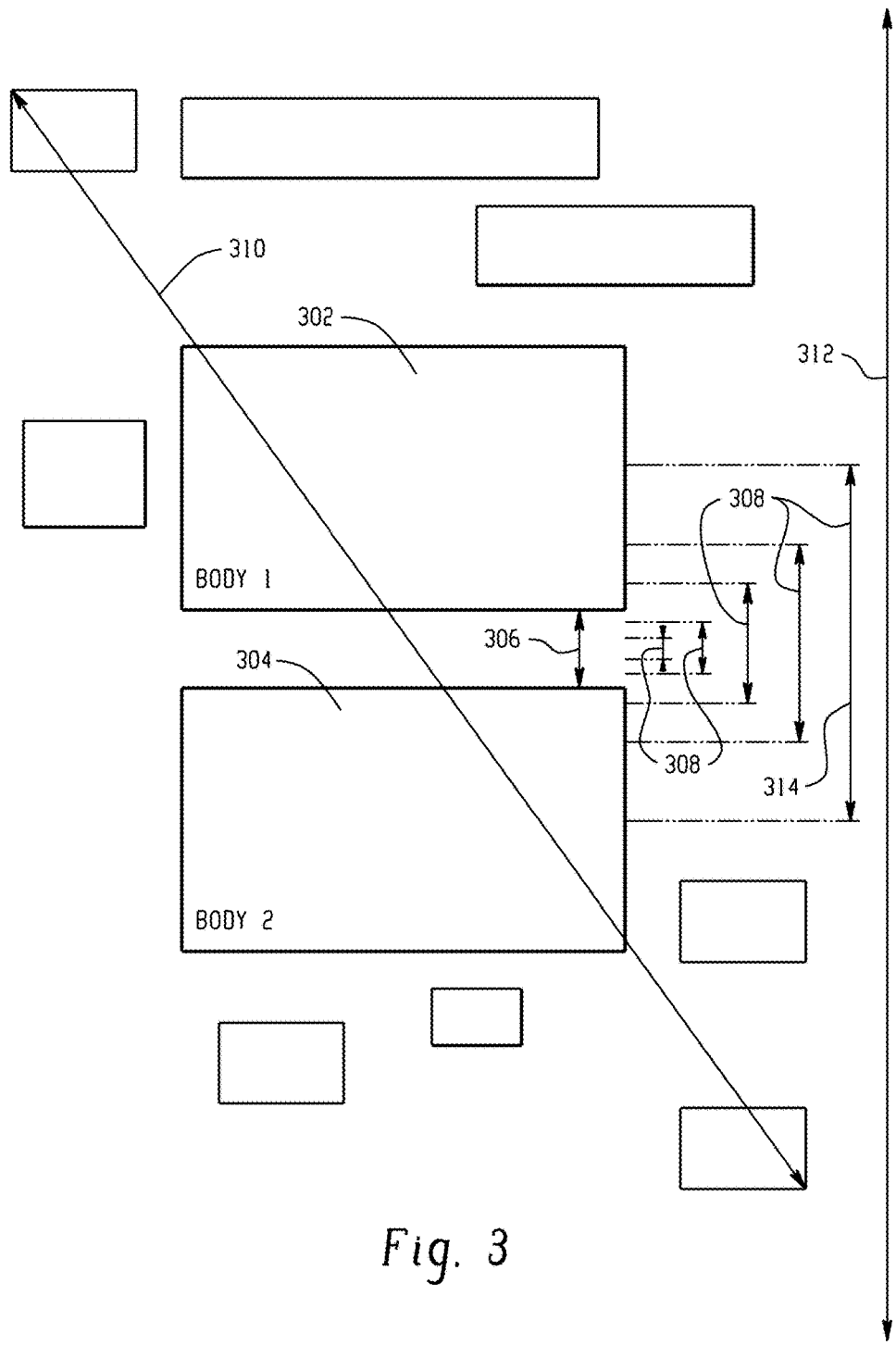
FIG. 3 is a diagram depicting an example process for determining a confidence level of contact between faces of two bodies.

FIG. 3 is a diagram depicting an example process for determining a confidence level of contact between faces of two bodies. As noted above, contact identification often devolves into a manual process, despite attempts at automated contact identification. A contact confidence engine, as described herein, automates identification of potential contacts between faces of simulated bodies and associates a confidence with each of those identified potential contacts. A user can use the confidences to limit the manual contact constructions. For example, users can limit their concentration on contacts identified with low confidences (e.g., 0-40%) to rectify them as needed, while accepting contacts indicated as having a high degree of confidence (e.g., 60% or greater).

FIG. 3 depicts a first body 302 and a second body 304 having faces separated by a distance 306. The process of FIG. 3 determines a first metric indicative of a confidence that the bottom face of the first body 302 is in contact with the top face of the second body 304 in a simulation. The process of FIG. 3 determines the first metric based on a comparison of the distance 306 between the bottom face of the first body 302 and the top face of the second body 304 to a plurality of tolerance distances 308. The first metric is based on a repeatability ratio of a count of the tolerances 308 that are greater than the distance 306 between the faces of the two bodies and the total number of tolerances 308 examined:

$$R = \text{Tolerances}_{Greater\ than\ Distance} / \text{Tolerances}_{Total}$$

For example, in one embodiment, a plurality of testing tolerances 308 are identified. For each of the identified testing tolerances 308, a determination is made as to whether the distance 306 between the bottom face of the first simulated body 302 and the top face of the second simulated body 304 is less than that identified testing tolerance. When the distance 306 between the bottom face of the first simulated body 302 and the top face of the second simulated body 304 is less than that identified testing tolerance, then a count of positive contact detections is increased by one. Following analysis of each of the plurality of identified testing tolerances 308, a repeatability ratio (R) of the count of positive detections to the total number of times the detections are run, where the confidence level of contact between the bottom face of the first simulated body 302 and the top face of the second simulated body 304 is based on that determined repeatability ratio (R).

The number of tolerances 308 selected and the sizes of the tolerances 308 may be selected in a variety of ways. In one embodiment, the number of tolerances 308 is selected to total at least 100. In an embodiment, the sizes of the tolerances 308 are selected based on a maximum tolerance. For example, the maximum tolerance can be set based on a largest assembly diagonal 310 of the simulation (e.g., the largest line that can be drawn between any two points in the simulation space). In one embodiment, the maximum tolerance is set as a portion of that largest assembly diagonal 310. In FIG. 3, the length of the largest assembly diagonal 310 is indicated at 312, where the maximum tolerance 314 is equal to a portion of the largest assembly diagonal 310. In certain embodiments, the sizes of the tolerances 308 are further selected based on a minimum tolerance. In one embodiment, the minimum tolerance is set at a zero gap or a near zero gap. In another example, the minimum tolerance is selected by performing a binary traversal from the maximum tolerance 314 to the zero gap, finding the smallest tolerance having some contacts identified (i.e., the distance between two simulated bodies is less than the candidate minimum tolerance) and no reductions in contacts identified over a prior tolerance evaluated in the binary traversal. This identified minimum tolerance is understood to be near the tightest geometric tolerance that was used to construct the model.

Having identified a maximum testing tolerance and a minimum testing tolerance, a plurality of intermediate tolerances are identified between the maximum and minimum testing tolerance to generate a set of tolerances for examination that meets the desired number of tolerances for evaluation. The intermediate tolerances can be identified in a number of ways.

In one embodiment, to generate n intermediate tolerances, a midpoint between the maximum testing tolerance and the minimum testing tolerance is identified as a next intermediate tolerance in the set of n. A next intermediate tolerance is selected as the midpoint between the last selected intermediate tolerance and the minimum testing tolerance. This midpoint identification process is repeated n times. Thus, in an example where the maximum testing tolerance is 1.00 and the minimum testing tolerance is 0.00, intermediate testing tolerances are identified at:

$$\text{Tolerances}_{n\text{-}intermediate} = \{0.5, 0.25, 0.125, \ldots\}$$

In a second embodiment, first quartile points are iteratively selected from a prior selected tolerance. For example, where the maximum testing tolerance is 1.00 and the minimum testing tolerance is 0.00, a first intermediate tolerance is selected one quarter of the way between those points, at 0.75. A second intermediate tolerance is then selected one quarter of the way between 0.75 and 0.00. The process is repeated to generate n intermediate tolerances, resulting in the set of:

$$Tolerances_{n\text{-}intermediate}=\{0.75, 0.5625, 0.4219, \ldots\}$$

In a third embodiment, first quartile points are iteratively selected, as in the second embodiment, with an additional m unique random points (e.g., 10 points) being selected within each of the first quartiles. This set can be represented as:

$$Tolerances_{n\text{-}intermediate}=\{\{10 \text{ random points between } 1.0 \text{ and } 0.75\}, 0.75, \{10 \text{ random points between } 0.75 \text{ and } 0.5625\}, 0.5625, \{10 \text{ random points between } 0.5625 \text{ and } 0.4219\} 0.4219, \ldots\}$$

Figure 4:
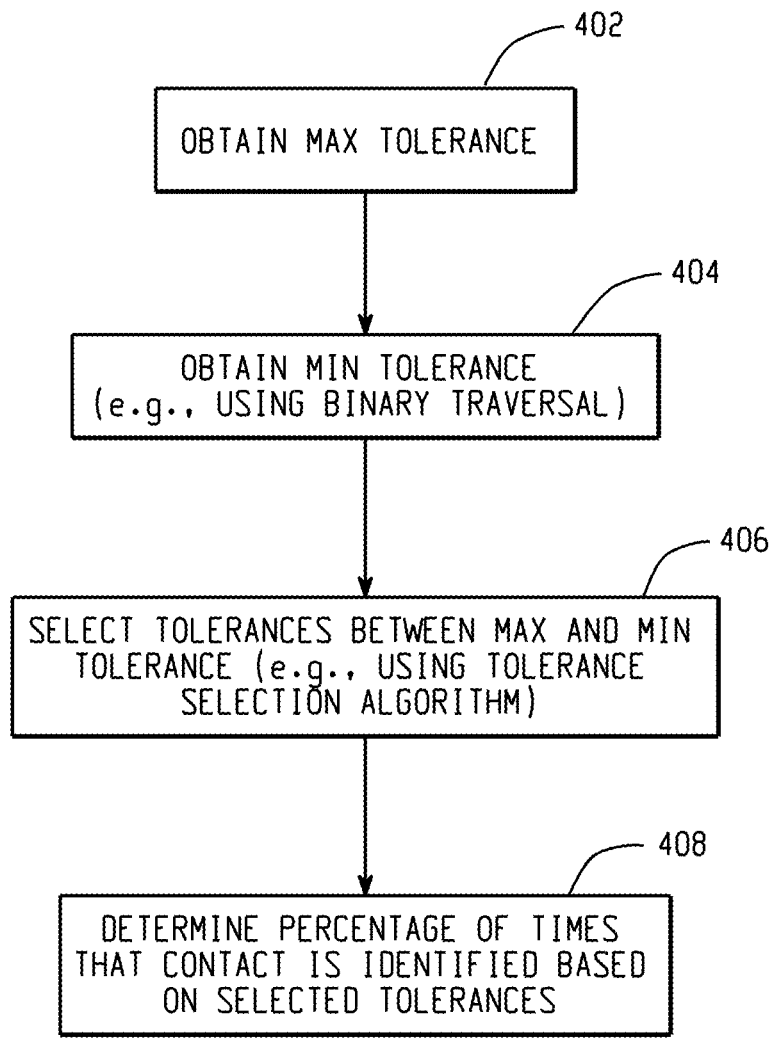
FIG. 4 is a flow diagram depicting an example process for determining a repeatability ratio (R) indicative of a confidence level of contact between geometric entities (e.g., faces) of two simulated bodies.

FIG. 4 is a flow diagram depicting an example process for determining a repeatability ratio (R) indicative of a confidence level of contact between geometric entities (e.g., faces) of two simulated bodies. At 402, a maximum testing tolerance is identified. At 404, a minimum testing tolerance is identified, such as through use of a binary traversal as described above. At 406, tolerances between the maximum and minimum testing tolerances (e.g., 98 intermediate tolerances to generate a total of 100 testing tolerances) are selected, such as using one of the three selection algorithms described above. At 408, a determination is made as to the percentage of times that contact is indicated based on the set of selected tolerances.

In one embodiment of the disclosure, the repeatability ratio (R) between the count of positive contact detections to the total number of testing tolerances (e.g., positive contacts/100 testing tolerances) can be returned as a confidence that the two faces under consideration are in contact. In other embodiments, the repeatability ratio (R) can be utilized with other measures, such as via a weighted sum, to determine a confidence level.

One example measure indicative of contact between faces of two simulated bodies is a minimum distance between the faces of the two bodies. That minimum distance ($d_{min}$) can be used to calculate a confidence measure D, such as based on the portion of largest assembly diagonal (indicated at 314 in FIG. 3), according to:

$$D=(1-d_{min}/(\text{portion size}*\text{Largest Diagonal}))*100\%$$

where in one example the portion size is equal to 0.0025. The confidence measure D can be utilized alone as an indicator of confidence that the faces of the two bodies are in contact or in combination with other measures. In one example, the confidence measure D is used in combination with a repeatability ratio (R) as described above such that:

$$\text{Confidence}=F_1R+F_2D,$$

where $F_1$, $F_2$ sum to 1.0.

Figure 5:
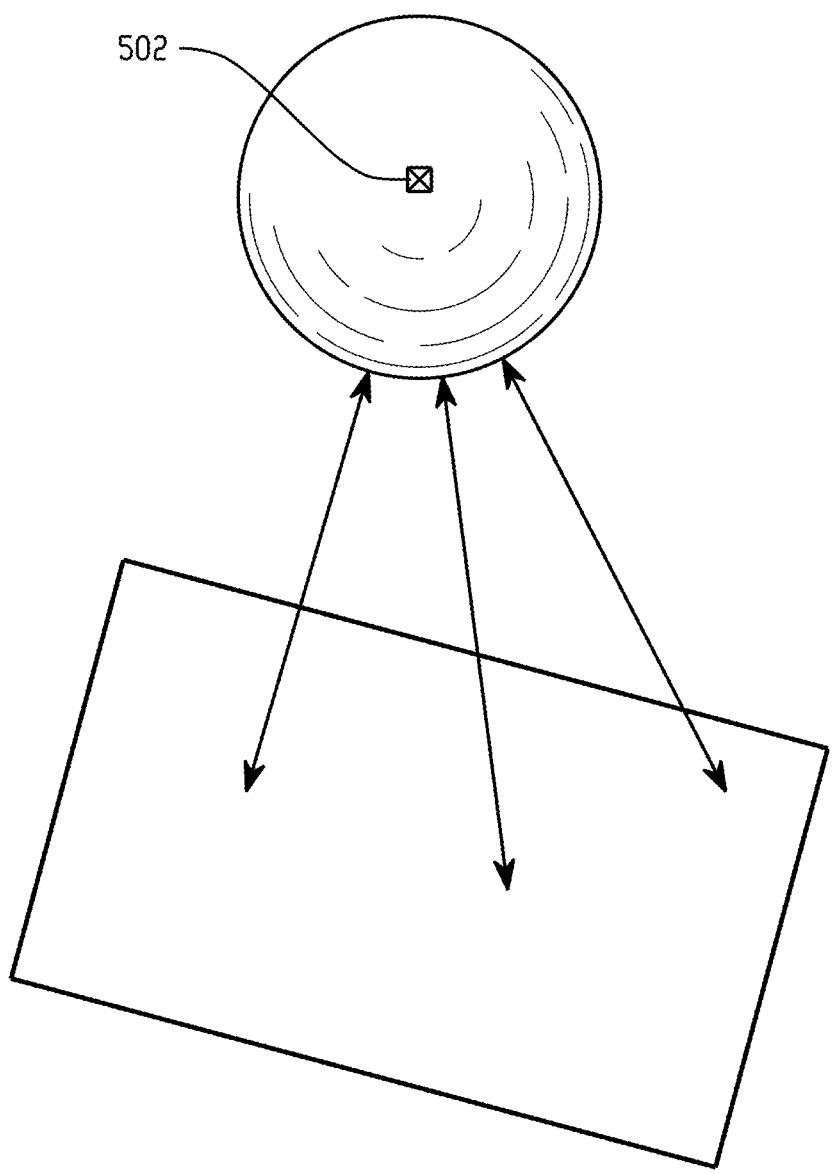
FIG. 5 is a diagram depicting identification of a minimum distance between faces of a sphere and a plane.

FIG. 5 is a diagram depicting identification of a minimum distance between a face of a sphere and a face of a plane. In one embodiment of the disclosure, faces of one or both of the first simulated body and the second simulated body are formed from a plurality of triangles (facets). A plurality of triangles of the sphere simulated body are indicated at 502. The minimum distance, $d_{min}$ is determined via normal projections from the centroid of each of those triangles. The length of the shortest of those normal projections that makes contact with the face of the plane is identified as the minimum distance, $d_{min}$. In another example, a meshing technology is used to surface mesh each side of suspected contacts and then project each triangle or quads element from one side to another, where the minimum distance, $d_{min}$, is determined as a shortest normal projection from a triangle or quads element that makes contact with an opposing face.

Another example measure indicative of contact between faces of two simulated bodies is an amount of overlap between the faces of the two bodies in a particular direction. For example a repeatability ratio of overlap of the faces of the simulated bodies relative to the area (or width) of the face of one (e.g., the maximum face area of the two bodies) of the simulated bodies (O) can be used alone to indicate confidence of contact between the two bodies or in combination with other contact confidence measures.

$$O=\text{Overlap}_{BetweenFacesOfTwoBodies}/\text{Area}_{ofFaceOfOneBody}$$

In another example embodiment, an overlap O can be determined as an average of the overlap area divided by the area of the first face and the overlap area divided by the area of the second face.

The confidence measure O can be utilized as an indicator of confidence that the faces of the two bodies are in contact in combination with other measures. In one example, the confidence measure O is used in combination with a repeatability ratio (R) as described above such that:

$$\text{Confidence}=F_1R+F_2O,$$

where $F_1$, $F_2$ sum to 1.0.

Figure 6:
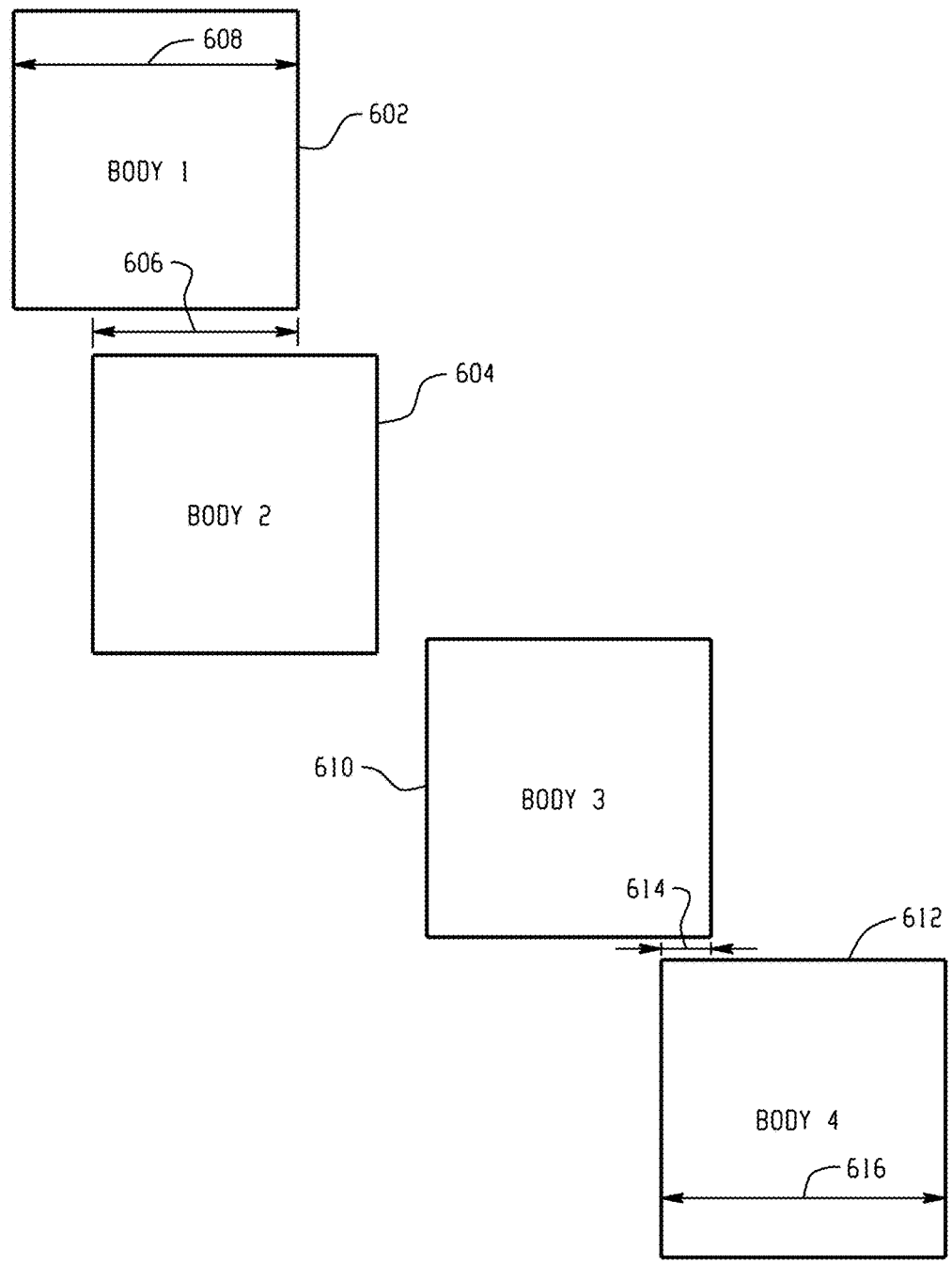
FIG. 6 is a diagram depicting example overlaps between faces of certain simulated bodies.

FIG. 6 is a diagram depicting example overlaps between faces of certain simulated bodies. A face of a first body 602 overlaps a face of a second body 604 by an amount 606 relative to the down direction. The ratio of the amount 606 to the width of the face of the first body 602 is about 0.75. A high level of overlap can be indicative of intended contact between faces of the two simulated bodies. In a second example, a face of a third body 610 overlaps a face of a fourth body 612 by an amount 614 relative to the down direction. The ratio of the amount 614 to the width of the face of the fourth body 616 is about 0.2. A low level of overlap can be indicative of no intended contact between faces of the two simulated bodies.

Overlap of faces of bodies can be computed using a variety of mechanisms. FIG. 6 describes determining of overlaps in two dimensions using a width of the face of one of the simulated bodies. In another example using three dimensional area overlaps, a meshing technology is used to surface mesh each side of suspected contacts and then project each triangle or quads element from one side to another, collecting the ones whose normals face each other and are almost collinear within a tolerance. The total area of such triangles can be used to determine the overlap area. The triangles or quads on one side can be used to indicate the area of that side for use in computing a ratio of overlapping area to total area of a surface of one of the simulated bodies.

Figure 7:
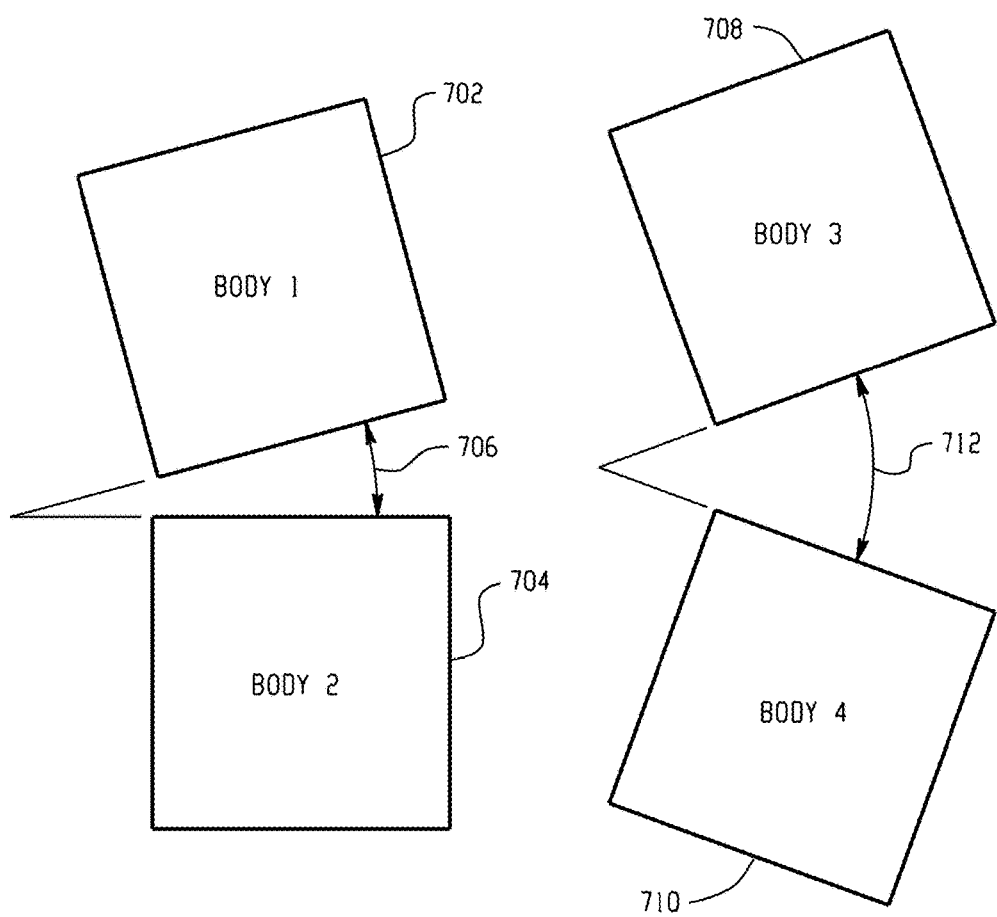
FIG. 7 is a diagram depicting example angles between faces of simulated bodies.

Another example measure indicative of contact between faces of two simulated bodies is an angle between faces of simulated bodies suspected of being in contact. Simulated faces of bodies having faces running parallel to one another (i.e., 0 degrees) are more likely to be intended to be in contact than faces of simulated bodies having large angles between faces. FIG. 7 is a diagram depicting example angles between faces of simulated bodies. A first body 702 is positioned above a second body 704. At 706, an indication of the angle between the faces of the first and second bodies 702, 704 is displayed. That angle is relatively small in magnitude. At third body 708 is positioned above a fourth body 710. At 712, an indication of a relatively larger angle between the faces of the third and fourth bodies is displayed. In one embodiment, the relatively larger angle 712 between the faces of the third body 708 and the fourth body 710 is indicative of a lower likelihood of intended contact compared to the faces of the first body 702 and the second body. In one example a confidence indicator A can be calculated according to:

$$A = (90 \text{ degrees} - \text{Angle}_{BetweenFaces})/90 \text{ degrees},$$

The confidence measure A can be utilized as an indicator of confidence that the faces of the two bodies are in contact in combination with other measures. In one example, the confidence measure A is used in combination with a repeatability ratio (R) as described above such that:

$$\text{Confidence} = F_1 R + F_2 A.$$

where $F_1$, $F_2$ sum to 1.0.

In addition to generation of confidences in contacts between faces of simulated bodies based on one or two confidence measures, confidences can further be based on more than two measures. For example, a confidence can be based on a combination of all of the four measures described herein, according to a weighted sum, such as:

$$\text{Confidence} = F_1 R + F_2 D + F_3 O + F_4 A,$$

where $F_1$, $F_2$, $F_3$, $F_4$ sum to 1.0.

FIG. 8 is a diagram depicting a contact confidence data structure configured to facilitate semi-automatic manual contact identification. A first column and a second column identify indexes associated with faces of simulated bodies in a simulation determined to be in contact. A third column indicates a confidence level that the two identified faces are in contact, such as based on determinations as described herein. In one embodiment, detected face contacts having lower confidence values are presented to a user for contact verification, such as in a semi-automatic fashion. In such an embodiment, face pairs having a confidence of less than 40% are provided to a user for manual contact verification. In one embodiment, a contact identification tool can graphically highlight each pair of faces of simulated bodies having confidences below 40% and prompt the user to indicate whether those faces are in contact. Upon providing a contact indication for a pair of faces, a next pair of simulated faces needing a contact indication is automatically presented, providing a semi-automated mechanism for verifying contacts for simulated faces having low confidences. In another embodiment, all simulated face pairs having a confidence level above a threshold (e.g., a user entered threshold) are confirmed as being in contact, while all simulated face pairs having a confidence level less than that threshold are rejected as not being in contact.

The example of FIG. 8 provides a sorted list of face pairs for which contact has been identified, along with determined confidences for those contacts. The depicted face pairs can be interacted with, according to user preference. In one example, a user works up from a bottom of the depicted sorted list, starting with face pairs having low confidence scores to verify or reject their detected contact. Such an operation prioritizes suspect face pairs having low confidence levels, where a system has a low degree of certainty that those face pairs are actually in contact.

This application uses examples to illustrate the invention. The patentable scope of the invention includes other examples. For example, while the examples described above describe detection of contacts between faces of bodies in a simulation, certain techniques described herein can be utilized to detect contacts between other entities of bodies, such as edges and vertices (e.g. detecting edge to edge contacts, edge to vertices contacts, vertices to face contacts). As another example, in addition to or in the alternative to making detections at the time of simulation setup, certain aspects of contact confidence detection described herein can also be performed during or after running of a simulation. As a further example, certain calculations and determinations as described herein can be accelerated via parallel processing (e.g., performing multiple face to face contact confidence determinations in separate threads).

It is claimed:

1. A computer-implemented method of performing a simulation of a physical assembly, comprising:
    accessing or generating at least one data structure describing one or more simulation bodies representative of one or more physical bodies associated with the physical assembly, the one or more simulation bodies including a first face and a second face;
    determining a confidence level of the first face and the second face of the one or more simulation bodies being in contact, wherein determining the confidence level comprises:
    identifying a plurality of testing tolerances;
    for each one of the identified testing tolerances:
        determining whether a distance between the first face and the second face is less than a respective one of the identified plurality of testing tolerances;
        increasing a count of positive detections based on the determining whether the distance between the first face and the second face is less than the respective one of the identified plurality of testing tolerances;
    determining a repeatability ratio of the count of positive detections to the total number of identified testing tolerances, wherein the confidence level is based on the determined repeatability ratio; and
    simulating a physical interaction to determine physical characteristic of the simulation bodies being in contact based on the determined confidence level of the first face and the second face of the simulation bodies being in contact.

2. The method of claim 1, wherein identifying the plurality of testing tolerances includes:
    identifying a maximum testing tolerance;
    identifying a minimum testing tolerance; and
    identifying a plurality of intermediate tolerances between the maximum testing tolerance and the minimum testing tolerance.

3. The method of claim 2, wherein the maximum testing tolerance is based on a size of a simulation body that includes the first face or the second face within an assembly.

4. The method of claim 3, wherein the simulation bodies are simulated within a simulation space and each comprise one or more spatial points, wherein the maximum testing tolerance is the longest line that can be drawn between any two points in the simulation space.

5. The method of claim 2, wherein the minimum testing tolerance is determined based on a binary traversal of tolerances between the maximum testing tolerance and a near zero tolerance, wherein a near zero tolerance is the smallest geometric tolerance used when creating one of the simulation bodies.

6. The method of claim 2, wherein the plurality of intermediate tolerances are selected between the maximum testing tolerance and the minimum testing tolerance.

7. The method of claim 2, wherein the plurality of intermediate tolerances are selected as points a fraction of a distance between a previously selected testing tolerance and the minimum testing tolerance.

8. The method of claim 7, wherein the plurality of testing tolerances further includes randomized testing tolerances selected between one of the previously selected testing tolerances and a point a fraction of a distance between that one of the previously selected testing tolerances and the minimum testing tolerance.

9. The method of claim 1, wherein the confidence level is based on a percentage of the identified testing tolerances for which the distance between the first face and the second face is less than the identified testing tolerances.

10. The method of claim 1, wherein the confidence level is based on the repeatability ratio and a confidence measure.

11. The method of claim 10, wherein the confidence level is based on a weighted sum of the repeatability ratio and the confidence measure.

12. The method of claim 10, wherein the confidence measure is based on a distance between the first face and the second face.

13. The method of claim 12, wherein the first face comprises a plurality of triangles, wherein the distance is determined as a shortest distance between one of the triangles and the second face measured along a line extending normal to a surface of the one of the triangles.

14. The method of claim 10, wherein the confidence measure is based on an amount of overlap area between the first face and the second face.

15. The method of claim 10, wherein the confidence measure is based on an angle between the first face and the second face.

16. The method of claim 2, wherein each of a plurality of tolerances are evaluated in a separate thread of a multi-threaded processor architecture.

17. The method of claim 10, wherein the confidence level is based on a weighted sum of:
the repeatability ratio;
a distance between the first face and the second face;
an amount of overlap area between the first face and the second face; and
an angle between the first face and the second face.

18. The method of claim 8, wherein the fraction changes on subsequent iterations.

19. The method of claim 1, wherein simulating a physical interaction based on the simulation bodies being in contact obtains a first result, further wherein simulating a physical interaction based on the simulation bodies not being in contact obtains a second result different than the first result.

20. A computer-implemented system for performing a simulation of a physical assembly, comprising:
one or more data processors;
a non-transitory computer-readable medium encoded with instructions for commanding the one or more data processors to execute steps that include:
accessing or generating at least one data structure describing one or more simulation bodies representative of one or more physical bodies associated with the physical assembly, the one or more simulation bodies including a first face and a second face;
determining a confidence level of the first face and the second face of the one or more simulation bodies being in contact, wherein determining the confidence level comprises:
identifying a plurality of testing tolerances;
for each one of the identified testing tolerances:
determining whether a distance between the first face and the second face is less than a respective one of the identified plurality of testing tolerances;
increasing a count of positive detections based on the determining whether the distance between the first face and the second face is less than the respective one of the identified plurality of testing tolerances;
determining a repeatability ratio of the count of positive detections to the total number of identified testing tolerances, wherein the confidence level is based on the determined repeatability ratio; and
simulating a physical interaction to determine physical characteristic of the simulation bodies being in contact based on the determined confidence level of the first face and the second face of the simulation bodies being in contact.

21. A computer-implemented method of performing a simulation of a physical assembly, comprising:
accessing or generating at least one data structure describing one or more simulation bodies representative of one or more physical bodies associated with the physical assembly, the one or more simulation bodies including a first geometric entity and a second geometric entity;
determining a confidence level of the first geometric entity and the second geometric entity of the one or more simulation bodies being in contact, wherein determining the confidence level comprises:
identifying a plurality of testing tolerances;
for each one of the identified plurality of testing tolerances;
determining whether a distance between the first geometric entity and the second geometric entity is less than a respective one of the identified plurality of testing tolerance;
increasing a count of positive detections based on the determining whether the distance between the first geometric entity and the second geometric entity is less than the identified plurality of testing tolerances;
determining a repeatability ratio of the count of positive detections to the total number of identified testing tolerances, wherein the confidence level is based on the determined repeatability ratio; and
simulating a physical interaction to determine physical characteristic of the simulation bodies being in contact based on the determined confidence level of the first geometric entity and the second geometric entity of the simulation bodies being in contact.

22. The method of claim 21, wherein the first geometric entity and the second geometric entity are each a face, an edge, or a vertex.

23. The method of claim 22, wherein contact is examined between: two faces, two edges, two vertices, a face and an edge, a face and a vertex, or an edge and a vertex.

* * * * *